(12) United States Patent
Tseng et al.

(10) Patent No.: US 11,527,475 B2
(45) Date of Patent: Dec. 13, 2022

(54) MEMORY DEVICES AND METHODS FOR FORMING THE SAME

(71) Applicant: Winbond Electronics Corp., Taichung (TW)

(72) Inventors: Ling-Chun Tseng, Taichung (TW); Shu-Ming Lee, Taichung (TW); Tzu-Ming Ou Yang, Tainan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 164 days.

(21) Appl. No.: 17/039,558

(22) Filed: Sep. 30, 2020

(65) Prior Publication Data

US 2021/0225763 A1 Jul. 22, 2021

(30) Foreign Application Priority Data

Jan. 20, 2020 (TW) ................................ 109101881

(51) Int. Cl.
| | |
|---|---|
| *H01L 23/522* | (2006.01) |
| *H01L 27/108* | (2006.01) |
| *H01L 21/768* | (2006.01) |
| *G11C 5/06* | (2006.01) |

(52) U.S. Cl.
CPC .......... *H01L 23/5226* (2013.01); *G11C 5/063* (2013.01); *H01L 21/76814* (2013.01); *H01L 27/10805* (2013.01); *H01L 27/10885* (2013.01); *H01L 27/10888* (2013.01)

(58) Field of Classification Search
CPC .......... H01L 23/5226; H01L 21/76814; H01L 27/10805; H01L 27/10885; H01L 27/10888; H01L 27/10814; H01L 27/10855; H01L 21/76897; G11C 5/063
See application file for complete search history.

(56) References Cited

U.S. PATENT DOCUMENTS

| | | | |
|---|---|---|---|
| 7,678,677 B2 | 3/2010 | Jang | |
| 10,796,950 B2* | 10/2020 | Lee | ........................ H01L 23/535 |
| 2017/0018553 A1* | 1/2017 | Lee | .................... H01L 27/10888 |
| 2019/0088739 A1* | 3/2019 | Lee | ........................ H01L 23/528 |

FOREIGN PATENT DOCUMENTS

| | | |
|---|---|---|
| KR | 20070070422 A | 7/2007 |
| KR | 10-1075526 B1 | 10/2011 |

* cited by examiner

*Primary Examiner* — Karen Kusumakar
(74) *Attorney, Agent, or Firm* — Muncy, Geissler, Olds & Lowe, P.C.

(57) ABSTRACT

A memory device includes a substrate, a bit line, a first insulating film, a second insulating film, a third insulating film, and a contact. The bit line is disposed over the substrate. The first insulating film is disposed on a sidewall of the bit line. The second insulating film is disposed on the first insulating film and is made of a different material than the first insulating film. The third insulating film is disposed on the second insulating film and is made of a different material than the second insulating film. The top surfaces of the second insulating film and the third insulating film are lower than the top surface of the first insulating film. The contact is disposed over the substrate and adjacent to the bit line. The width of the lower portion of the contact is less than the width of the upper portion of the contact.

15 Claims, 8 Drawing Sheets

MEMORY DEVICES AND METHODS FOR FORMING THE SAME

CROSS REFERENCE TO RELATED APPLICATIONS

This Application claims priority of Taiwan Patent Application No. 109101881, filed on Jan. 20, 2020, the entirety of which is incorporated by reference herein.

BACKGROUND OF THE INVENTION

Field of the Invention

The present disclosure relates to semiconductor manufacturing, and, in particular, to memory devices and methods for forming the same.

Description of the Related Art

As semiconductor devices are gradually miniaturized, the difficulty of manufacturing these semiconductor devices increases dramatically, and undesirable defects may occur during the manufacturing process, which may cause degradation or damage to the device. For example, due to the reduced size, aligning components becomes difficult, and current leakage or short circuits may occur in the devices. Therefore, semiconductor devices must be continuously improved to increase the yield and improve the process window.

BRIEF SUMMARY OF THE INVENTION

In accordance with some embodiments of the present disclosure, a memory device is provided. The memory device includes a substrate, a bit line, a first insulating film, a second insulating film, a third insulating film, and a contact. The bit line is disposed over the substrate. The first insulating film is disposed on a sidewall of the bit line. The second insulating film is disposed on the first insulating film. The second insulating film is made of a different material than the first insulating film. The top surface of the second insulating film is lower than the top surface of the first insulating film. The third insulating film is disposed on the second insulating film. The third insulating film is made of a different material than the second insulating film. The top surface of the third insulating film is lower than the top surface of the first insulating film. The contact is disposed over the substrate and adjacent to the bit line. The contact has a lower portion that is lower than the top surface of the third insulating film and an upper portion that is higher than the top surface of the third insulating film. The width of the lower portion of the contact is less than the width of the upper portion of the contact.

In accordance with some embodiments of the present disclosure, a method of forming memory devices is provided. The method includes forming a bit line on a substrate; sequentially forming a first insulating film, a second insulating film, and a third insulating film on the bit line (wherein the first insulating film and the third insulating film are made of different materials than the second insulating film); etching the top portion of the second insulating film and the top portion of the third insulating film to expose the top portion of the first insulating film; re-etching the third insulating film to lower the height of the third insulating film after forming a protective film on the first insulating film; removing the protective film; re-etching the second insulating film to lower the height of the second insulating film; and forming a contact adjacent to the bit line over the substrate. The width of the lower portion of the contact is less than the width of the upper portion of the contact.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1A:
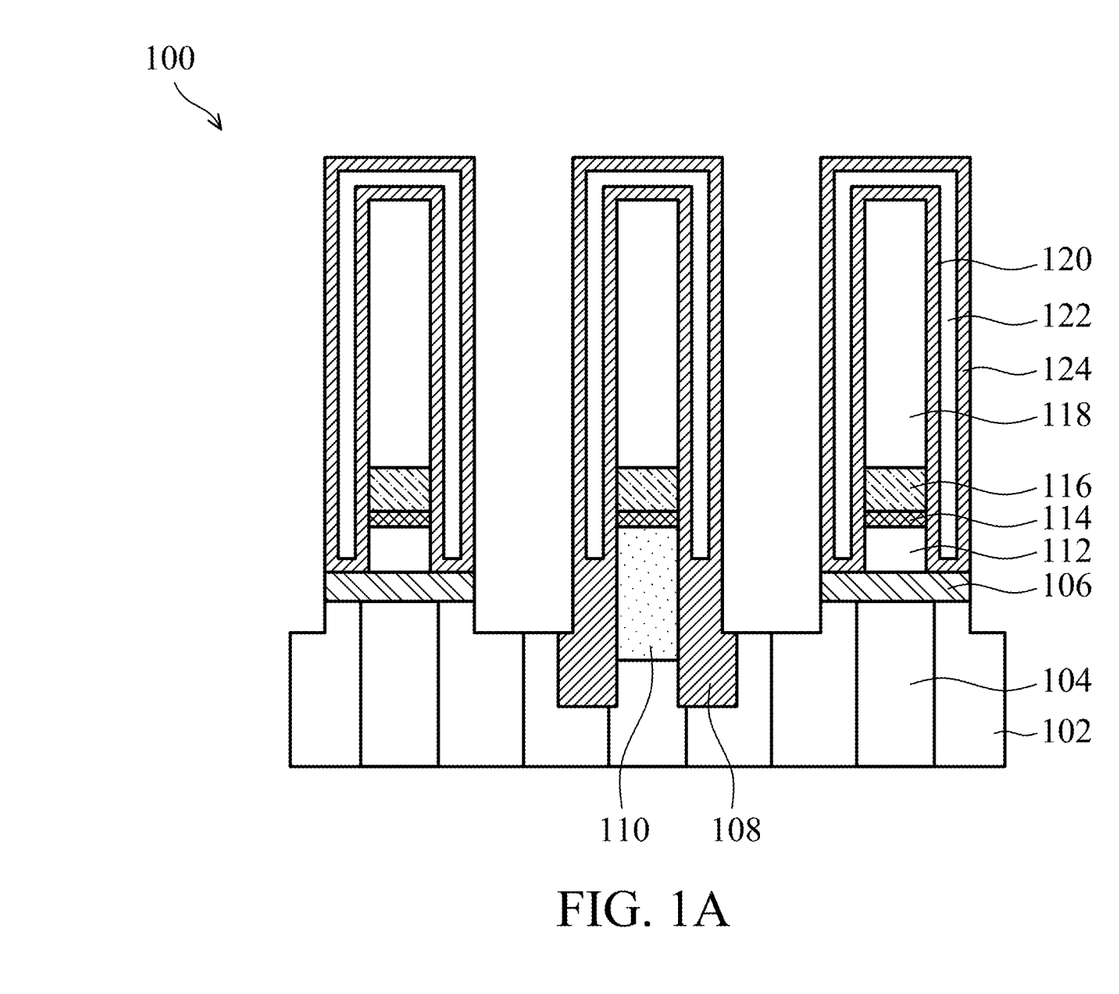
FIGS. 1A-1B are cross-sectional views illustrating various stages of manufacturing a memory device in accordance with some embodiments.
Figure 1B:
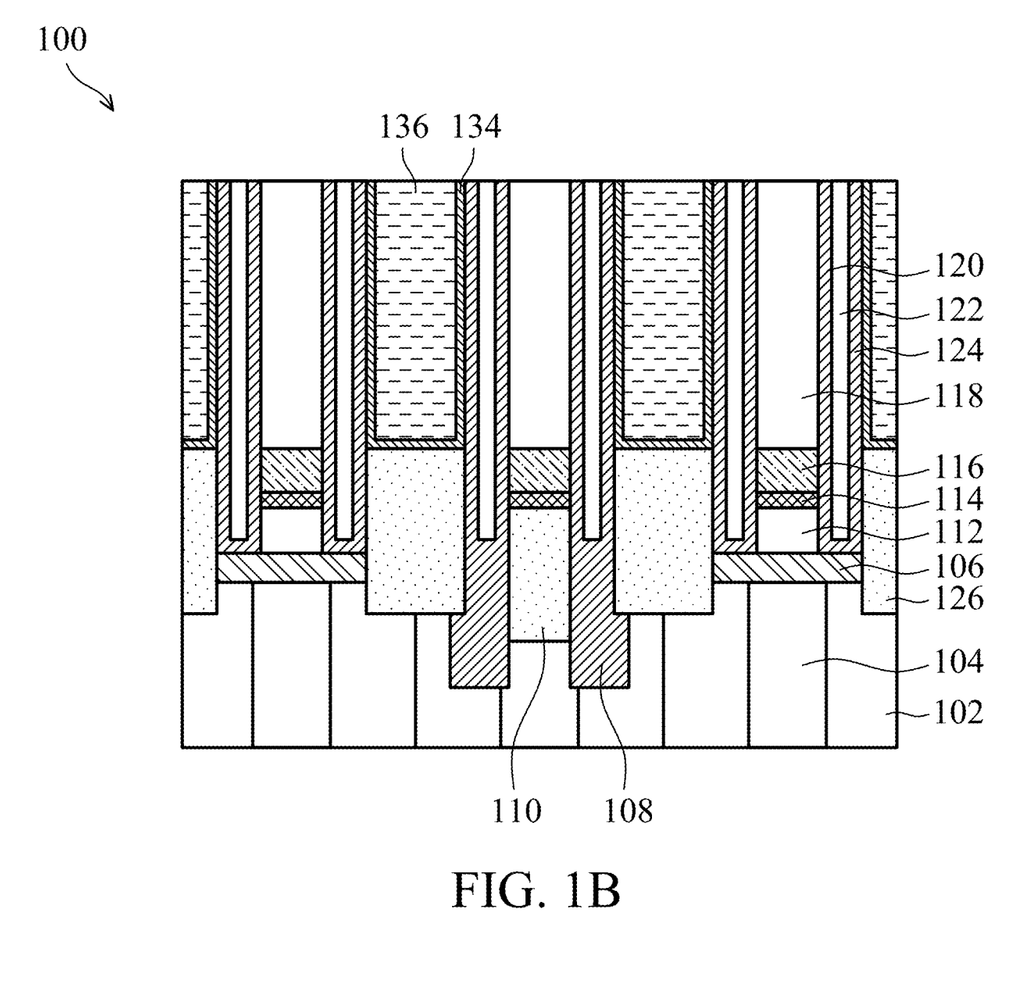

FIGS. 1A-1B are cross-sectional views illustrating various stages of manufacturing a memory device 100 according to some embodiments. As illustrated in FIG. 1A, the memory device 100 may include a substrate 102, and an isolation structure 104 may be formed in the substrate 102 to electrically isolate components. In some embodiments, a mask layer (not illustrated) is disposed on the substrate 102, and then an etching process is performed with the mask layer as an etching mask to etch trenches (not illustrated) in the substrate 102.

According to some embodiments, as illustrated in FIG. 1A, an insulating material is filled in the trenches to form the isolation structure 104.

Next, according to some embodiments, an insulating layer 106 is formed on the substrate 102. An insulating material may be formed on the substrate 102 by a deposition process, and the insulating material may be patterned to form the insulating layer 106 at a predetermined position. Then, a spacer 108 and a bit line contact 110 between the spacer 108 may be formed in the substrate 102.

Then, an insulating layer 112 may be formed on the insulating layer 106.

Still referring to FIG. 1A, a barrier layer 114, a bit line 116, and a mask layer 118 may be sequentially formed on the insulating layer 106 and the bit line contact 110. In some embodiments, the material of the barrier layer 114 includes titanium, titanium nitride, titanium oxide, tantalum, tantalum nitride, tantalum oxide, the like, or a combination thereof.

The material of the bit line 116 may include a conductive material, such as doped or undoped polycrystalline silicon, a metal, the like, or a combination thereof. The material of the mask layer 118 may include silicon oxide, silicon nitride, silicon oxynitride, silicon carbide, silicon carbonitride, the like, or a combination thereof. Then, the insulating layer 112, the barrier layer 114, the bit line 116, and the mask layer 118 may be etched in the same etching process, and the bit line contact 110, the barrier layer 114, bit line 116 and mask layer 118 may be etched in the same etching process.

Next, according to some embodiments, a first insulating film 120, a second insulating film 122, and a third insulating film 124 are sequentially formed on sidewalls of the bit line contact 110, the insulating layer 112, the barrier layer 114, the bit line 116, and the mask layer 118. In particular, as illustrated in FIG. 1A, the first insulating film 120 may cover the top surface of the mask layer 118, the second insulating film 122 may be located on the first insulating film 120, and the third insulating film 124 may be located on the second insulating film 122.

According to some embodiments, the material of the first insulating film 120 and the material of the second insulating film 122 are different, and the material of the second insulating film 122 and the material of the third insulating film 124 are different. In some embodiments, the material of the first insulating film 120 and the material of the third insulating film 124 are the same. For example, the material of the first insulating film 120 and the material of the third insulating film 124 may include a nitride, such as silicon nitride, and the material of the second insulating film 122 may include an oxide, such as silicon oxide.

Then, according to some embodiments, as illustrated in FIG. 1B, a contact plug 126 may be formed adjacent to the bit line 116 over the substrate 102. As illustrated in FIG. 1B, the contact plugs 126 may be located between adjacent bit lines 116.

Next, according to some embodiments, as illustrated in FIG. 1B, an upper portion of the contact plug 126 is removed to form a trench (not illustrated) by an etching process. Then, according to some embodiments, a liner layer 134 is conformally formed in the trench. In some embodiments, the material of the liner 134 includes titanium, titanium nitride, titanium oxide, tantalum, tantalum nitride, tantalum oxide, the like, or a combination thereof.

Next, according to some embodiments, a contact 136 is formed in the remaining portion of the trench.

Then, according to some embodiments, other components, such as capacitors, that are electrically connected to the contact 136 are formed on the contact 136. However, in these embodiments, when the elements are not aligned with the top surface of the contact 136, problems such as leakage or short circuit are easily occurred, causing the memory device 100 to fail.

Alternatively, according to other embodiments, in order to avoid the problems caused by the above misalignment, before other elements electrically connected to the contact 136 are formed, an additional conductive material (not illustrated) is formed on the contact 136 to electrically connect the contacts 136 and these components. However, in the embodiment in which the additional conductive material is formed, not only process steps are added, defects or other problems may also be introduced during these process steps, thereby reducing the reliability of the memory device 100. Therefore, the present disclosure further provides the following embodiments to solve the above problems.

Figure 2A:
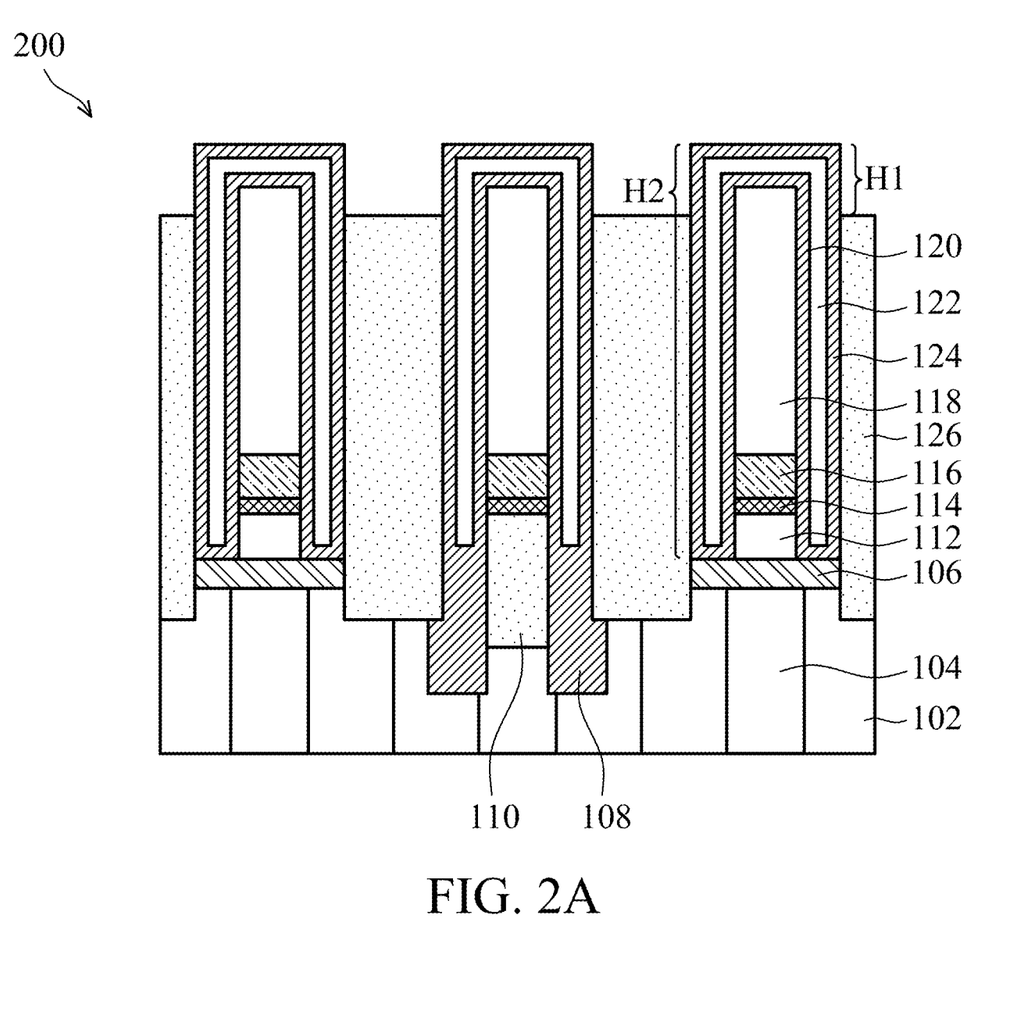
FIGS. 2A-2F are cross-sectional views illustrating various stages of manufacturing a memory device in accordance with some embodiments.

FIGS. 2A-2F are cross-sectional views illustrating a memory device 200 according to some other embodiments. FIG. 2A is a process step following FIG. 1A. For simplicity, the same elements are described below with the same symbols. The formation and materials of these elements are as described above, and will not be repeated.

Compared to the embodiment illustrated in FIG. 1B where a component is directly formed on the contact 136, the following embodiments adjust the shape of the contact 136, so that the subsequently formed components can be more easily electrically connected to the contact 136.

According to some embodiments, as illustrated in FIG. 2A, a portion of the contact plug 126 is removed by an etching process to expose the top portion of the third insulating film 124, and the remaining portion of the contact plug 126 covers sidewalls of the third insulating film 124. As illustrated in FIG. 2A, the top portion of the exposed third insulating film 124 has a height H1, which may be measured from the top surface of the third insulating film 124 to the top surface of the contact plug 126. The entire third insulating film 124 has a height H2, which may be measured from the top surface of the third insulating film 124 to the bottom surface of the third insulating film 124. According to some embodiments, the ratio of the height H1 to the height H2 is in a range of about 0.05 to about 0.26, for example, the height H2 is about 150 nm, and the height H1 is about 20 nm.

Figure 2B:
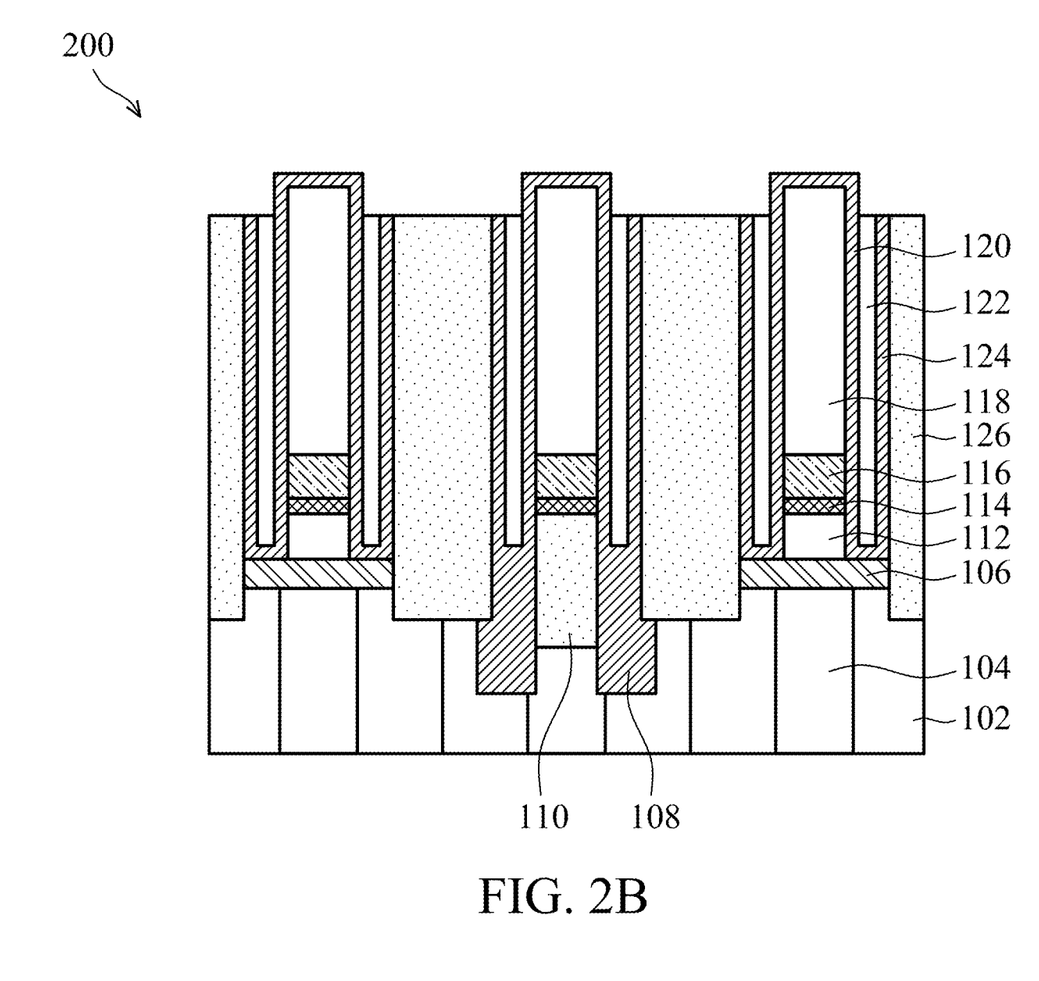

Then, according to some embodiments, as illustrated in FIG. 2B, the top portion of the second insulating film 122 and the top portion of the third insulating film 124 are removed by an etching process to expose the top portion of the first insulating film 120. In some embodiments, the top surface of the second insulating film 122 and the top surface of the third insulating film 124 are substantially aligned with the top surface of the contact plug 126, as illustrated in FIG. 2B. In particular, since the portion covered by the contact plug 126 is not affected by the etching process, the position of the top surface of the second insulating film 122 and the position of the top surface of the third insulating film 124 can be adjusted by adjusting the height of the contact plug 126.

Figure 2C:
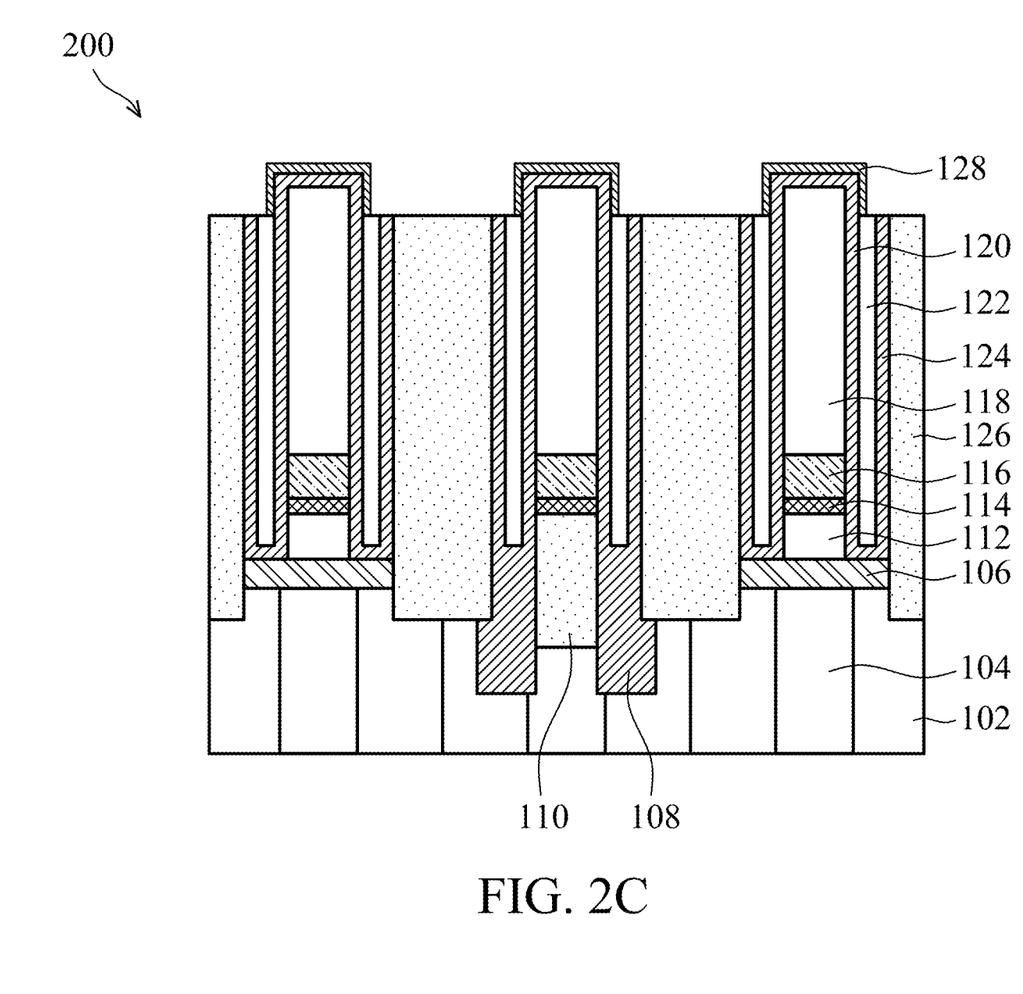

Next, according to some embodiments, as illustrated in FIG. 2C, a protective film 128 is formed on the exposed top portion of the first insulating film 120 to protect the first insulating film 120 from the subsequent etching process. The protective film 128 may be made of a material that is easier to be formed only on the first insulating film 120, and thus an additional etching process for removing portions not formed on the first insulating film 120 may be omitted. For example, when the first insulating film 120 includes a nitride, the material of the protective film 128 may include a carbon chain compound, such as CxHy. In some embodiments, the protective film 128 may be formed by applying a carbon-containing gas, such as $CH_4$, $CH_3F$, the like, or a combination thereof.

Figure 2D:
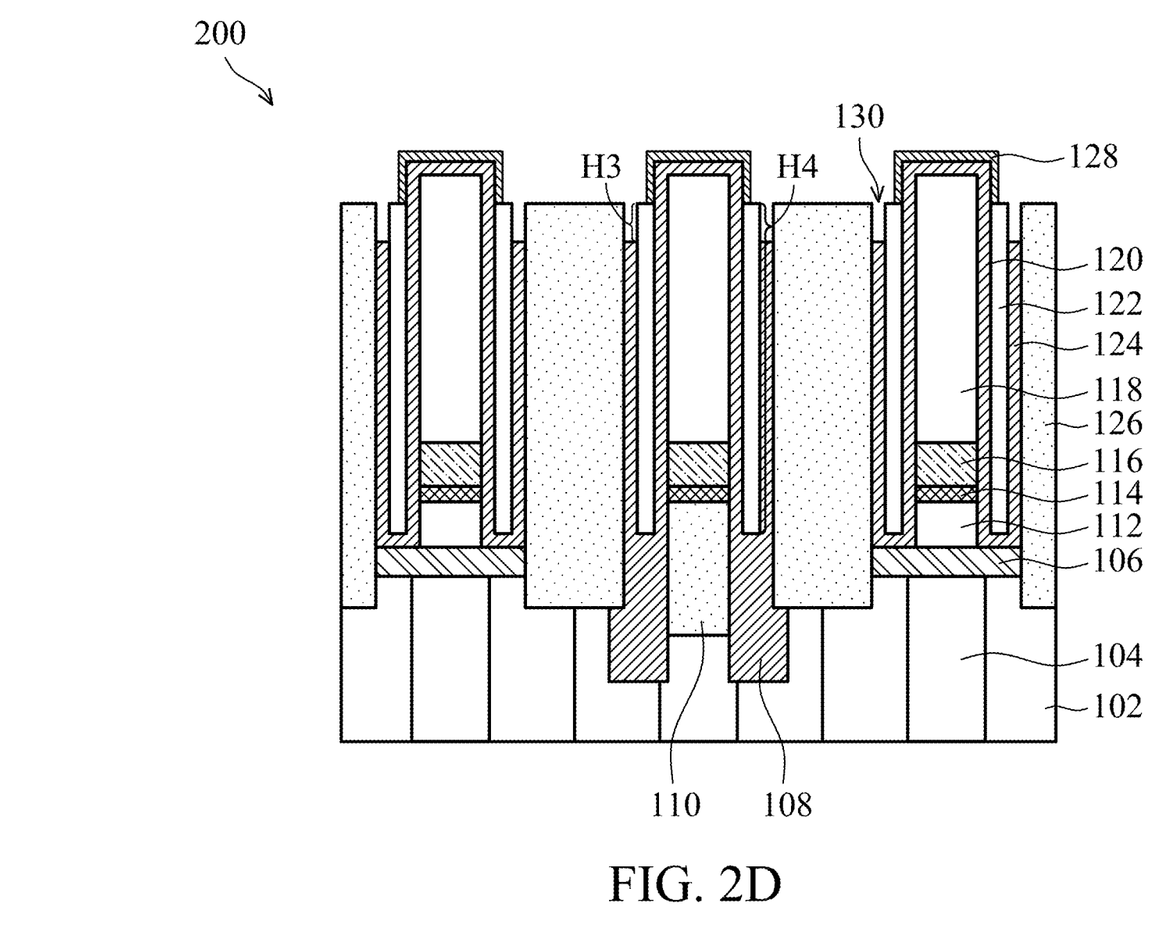

Then, according to some embodiments, as illustrated in FIG. 2D, the third insulating film 124 is etched again to reduce the height of the third insulating film 124 by using an etching process having different etching selection ratios for nitride and oxide. In some embodiments, the re-etching of the third insulating film 124 forms a trench 130 between the second insulating film 122 and the contact plug 126, and a portion of the sidewall of the second insulating film 122 is exposed by the trench 130. As illustrated in FIG. 2D, the exposed portion of the second insulating film 122 has a height H3, i.e. the depth of the trench 130, which may be measured from the top surface of the second insulating film 122 to the top surface of the third insulating film 124. The second insulating film 122 has a height H4, which may be measured from the top surface of the second insulating film 122 to the bottom surface of the second insulating film 122. According to some embodiments, the ratio of the height H3 to the height H4 is in the range of about 0.02 to about 0.1, such as the height H3 is about 10 nm, and the height H4 is about 145 nm.

Figure 2E:
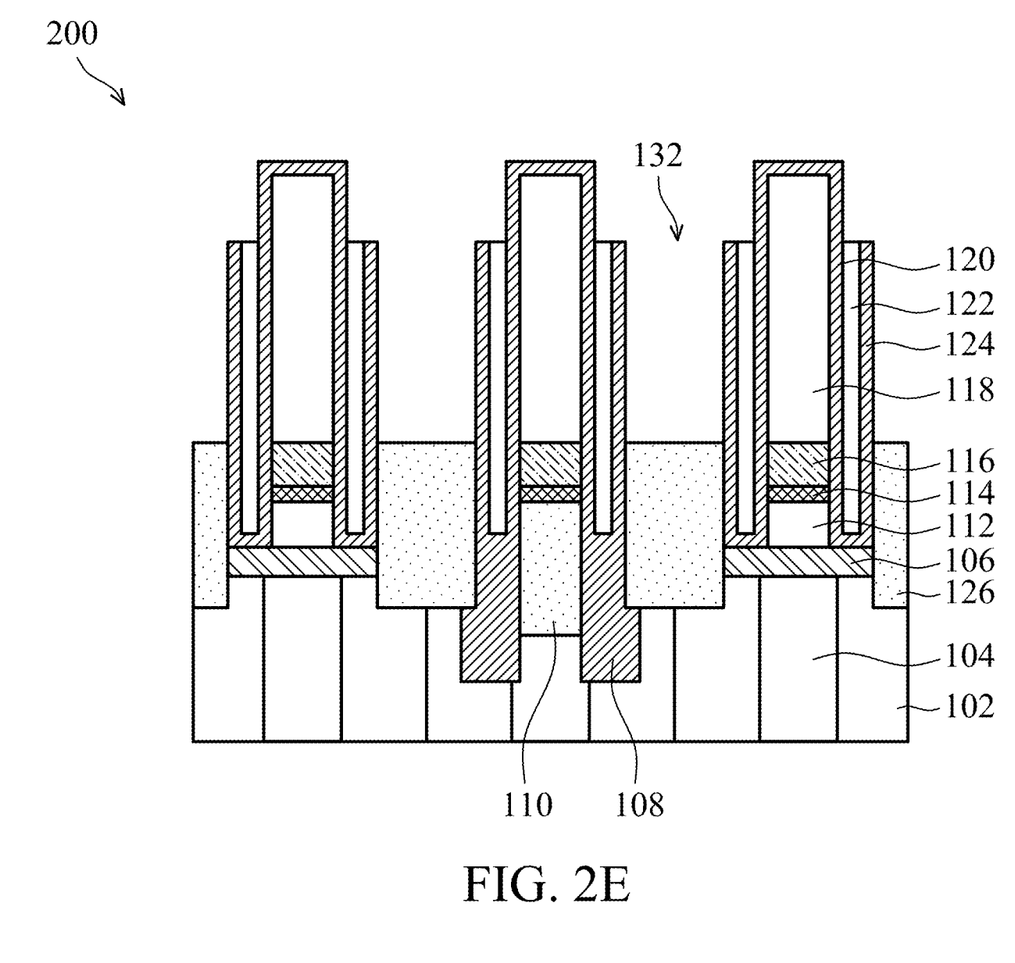

Next, according to some embodiments, as illustrated in FIG. 2E, the protective film 128 is removed to expose the top portion of the first insulating film 120 again. In some embodiments, the protective film 128 may be removed by an ashing process. Then, according to some embodiments, the second insulating film 122 is etched again to remove the exposed portion of the second insulating film 122 and to reduce the height of the second insulating film 122 so that the top surface of the second insulating film 122 is substantially aligned with the top surface of the insulating film 124. As illustrated in FIG. 2E, after the etching process, the top surface of the second insulating film 122 and the top surface of the third insulating film 124 are lower than the top surface of the first insulating film 120. In addition, the second insulating film 122 may be etched before or after removing the protective film 128.

Then, according to some embodiments, an upper portion of the contact plug 126 is removed to form a trench 132 by an etching process. As illustrated in FIG. 2E, the top surface of the contact plug 126 is lower than the top surface of the second insulating film 122 and the top surface of the third insulating film 124.

Figure 2F:
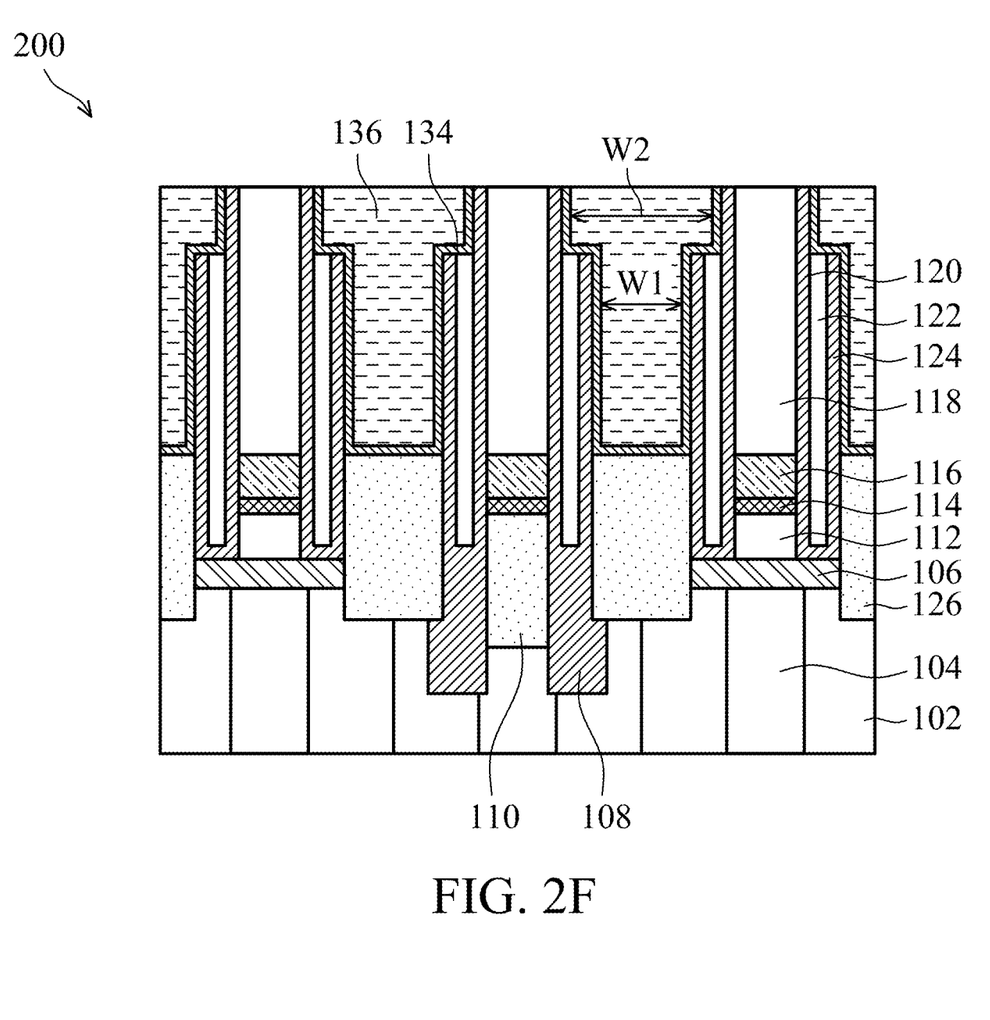

Then, according to some embodiments, as illustrated in FIG. 2F, a liner layer 134 is conformally formed in the trench 132, and a contact 136 is formed in the remaining portion of the trench 132, wherein the contact 136 is formed over the substrate 102 and adjacent to the bit line 116. In some embodiments, as illustrated in FIG. 2F, opposite sides of the contact 136 have stepped sidewalls, but the present disclosure is not limited thereto. For example, the contact 136 may have a stepped sidewall on only one side.

As illustrated in FIG. 2F, the liner layer 134 is disposed between the first insulating film 120 and the contact 136, and covers the top surface of the second insulating film 122 and the top surface of the third insulating film 124, and further extends between the third insulating film 124 and the contact 136 and between the contact 136 and the contact plug 126.

According to some embodiments, as illustrated in FIG. 2F, the lower portion of the contact 136 is lower than the top surface of the second insulating film 122 and the top surface of the third insulating film 124, and the upper portion of the contact 136 is higher than the top surface of the insulating film 122 and the top surface of the third insulating film 124. The lower portion of the contact has a width W1, and the upper portion of the contact 136 has a width W2. In some embodiments, the width W1 of the lower portion of the contact 136 is less than the width W2 of the upper portion of the contact 136. For example, the ratio of the width W1 of the lower portion of the contact 136 to the width W2 of the upper portion of the contact 136 is in the range of about 1.1 to 1.8. For example, the width W1 is about 50 nm and the width W2 is about 35 nm. Compared to the width of the top surface of the contact 136 substantially equal to the width of the bottom surface of the contact 136 in FIG. 1B, the embodiments illustrated in FIGS. 2A-2F where the width of the top surface of the contact 136 in FIG. 2F is increased, and components subsequently formed on the contact 136 are easier to align with the contact 136. Therefore, the process window can be improved, and the reliability of the memory device 200 can be increased.

In summary, the method for forming a memory device provided by the present disclosure increases the width of the top surface of the contact by removing a portion of the insulating film, and the contact with a wide upper portion and a narrow lower portion enable the electrical connection between the subsequently-formed components (such as capacitors) and the contact becomes easy. Therefore, the process window can be improved, and the reliability of the memory device can be increased.

What is claimed is:

1. A memory device, comprising:
    a bit line disposed over a substrate;
    a first insulating film disposed on a sidewall of the bit line;
    a second insulating film disposed on the first insulating film, wherein the second insulating film is made of a different material than the first insulating film, and a top surface of the second insulating film is lower than a top surface of the first insulating film, and a bottom surface of the second insulating film is higher than a bottom surface of the first insulating film;
    a third insulating film disposed on the second insulating film, wherein the third insulating film is made of a different material than the second insulating film, and a top surface of the third insulating film is lower than the top surface of the first insulating film; and
    a contact disposed over the substrate and adjacent to the bit line, wherein the contact has a lower portion that is lower than the top surface of the third insulating film and an upper portion that is higher than the top surface of the third insulating film, and a width of the lower portion of the contact is less than a width of the upper portion of the contact, wherein the lower portion of the contact has a first thickness, and the upper portion of the contact has a second thickness between the top surface of the third insulating film and the top surface of the first insulating film, and the first thickness is greater than the second thickness.

2. The memory device as claimed in claim 1, wherein the contact has a stepped sidewall.

3. The memory device as claimed in claim 1, wherein the top surface of the third insulating film is substantially aligned with the top surface of the second insulating film.

4. The memory device as claimed in claim 1, wherein the first insulating film and the third insulating film comprise a nitride, and the second insulating film comprises an oxide.

5. The memory device as claimed in claim 1, further comprising a mask layer disposed on the bit line, and the first insulating film, the second insulating film, and the third insulating film are on a sidewall of the mask layer.

6. The memory device as claimed in claim 1, wherein a bottom portion of the first insulating film extends below a bottom portion of the second insulating film.

7. The memory device as claimed in claim 1, wherein the first insulating film is in contact with the third insulating film.

8. The memory device as claimed in claim 1, wherein a ratio of the width of the lower portion of the contact to the width of the upper portion of the contact is in the range of about 1.1 to 1.8.

9. The memory device as claimed in claim 1, further comprising a spacer disposed below and in contact with the first insulating film.

10. The memory device as claimed in claim 9, wherein the spacer has a stepped sidewall.

11. A method of forming memory devices, comprising:
    forming a bit line on a substrate;
    sequentially forming a first insulating film, a second insulating film, and a third insulating film on the bit line, wherein the first insulating film and the third insulating film are made of different materials than the second insulating film;
    etching a top portion of the second insulating film and a top portion of the third insulating film to expose a top portion of the first insulating film;
    re-etching the third insulating film to lower a height of the third insulating film after forming a protective film on the first insulating film;
    removing the protective film;
    re-etching the second insulating film to lower a height of the second insulating film; and forming a contact adjacent to the bit line over the substrate, wherein a width of the lower portion of the contact is less than a width of the upper portion of the contact.

12. The method as claimed in claim 11, wherein the lower portion of the contact is lower than a top surface of the third insulating film, and the upper portion of the contact is higher than the top surface of the third insulating film.

13. The method as claimed in claim 11, wherein the protective film comprises carbon.

14. The method as claimed in claim 11, wherein re-etching the third insulating film exposes a sidewall of the second insulating film.

15. The method as claimed in claim 11, further comprising conformally forming a liner layer on the first insulating film and the third insulating film before forming the contact.

* * * * *